United States Patent
Foster et al.

(10) Patent No.: US 7,713,786 B2
(45) Date of Patent: May 11, 2010

(54) ETCHING/BONDING CHAMBER FOR ENCAPSULATED DEVICES AND METHOD OF USE

(75) Inventors: John S. Foster, Santa Barbara, CA (US); Jeffrey F. Summers, Santa Barbara, CA (US)

(73) Assignee: Innovative Micro Technology, Goleta, GA (US)

( * ) Notice: Subject to any disclaimer, the term of this patent is extended or adjusted under 35 U.S.C. 154(b) by 110 days.

(21) Appl. No.: 11/826,841

(22) Filed: Jul. 19, 2007

(65) Prior Publication Data

US 2009/0023244 A1 Jan. 22, 2009

(51) Int. Cl.
*H01L 21/00* (2006.01)

(52) U.S. Cl. .................. 438/115; 438/106; 438/107; 438/121

(58) Field of Classification Search .......... 438/106, 438/107, 115, 118, 121, 125, 127
See application file for complete search history.

(56) References Cited

U.S. PATENT DOCUMENTS

| | | | | |
|---|---|---|---|---|
| 5,895,233 A * | 4/1999 | Higashi et al. | ............. | 438/107 |
| 6,592,771 B1 * | 7/2003 | Yamanaka et al. | ............ | 216/63 |
| 6,867,543 B2 * | 3/2005 | Wang et al. | ................ | 313/553 |
| 6,908,561 B1 * | 6/2005 | Foust et al. | ................ | 216/13 |
| 7,042,075 B2 * | 5/2006 | Liebeskind | ................ | 257/682 |
| 7,202,602 B2 * | 4/2007 | Anandan | .................... | 313/512 |
| 7,314,777 B2 * | 1/2008 | DCamp et al. | ............. | 438/106 |
| 7,473,616 B2 * | 1/2009 | Yang | ......................... | 438/455 |
| 2004/0262613 A1 | 12/2004 | Maekawa et al. | | |
| 2005/0001324 A1 | 1/2005 | Dunn et al. | | |
| 2005/0142685 A1 * | 6/2005 | Ouellet et al. | ................ | 438/51 |
| 2005/0224978 A1 | 10/2005 | Kawate et al. | | |
| 2005/0269678 A1 | 12/2005 | Martin et al. | | |
| 2006/0105503 A1 * | 5/2006 | Ding et al. | .................. | 438/125 |
| 2006/0138343 A1 | 6/2006 | Nakasuji et al. | | |
| 2006/0284556 A1 * | 12/2006 | Tremel et al. | ............... | 313/512 |
| 2007/0087543 A1 * | 4/2007 | Piebe et al. | ................ | 438/601 |
| 2007/0111471 A1 * | 5/2007 | Okada | ......................... | 438/455 |
| 2007/0205720 A1 * | 9/2007 | Sparks et al. | ............... | 313/553 |
| 2008/0111203 A1 * | 5/2008 | Pan et al. | .................... | 257/415 |
| 2008/0179183 A1 * | 7/2008 | Boitnott et al. | ........ | 204/192.35 |
| 2008/0226902 A1 * | 9/2008 | Giannantonio et al. | ...... | 428/336 |

* cited by examiner

*Primary Examiner*—Charles D Garber
*Assistant Examiner*—Bryan R Junge
(74) *Attorney, Agent, or Firm*—Jaquelin K. Spong

(57) ABSTRACT

A method for activating a getter at low temperature for encapsulation in a device cavity containing a microdevice comprises etching a passivation layer off the getter material while the device wafer and lid wafer are enclosed in a bonding chamber. A plasma etching process may be used, wherein by applying a large negative voltage to the lid wafer, a plasma is formed in the low pressure environment within the bonding chamber. The plasma then etches the passivation layer from the getter material, which is directly thereafter sealed within the device cavity of the microdevice, all within the etching/bonding chamber.

17 Claims, 7 Drawing Sheets

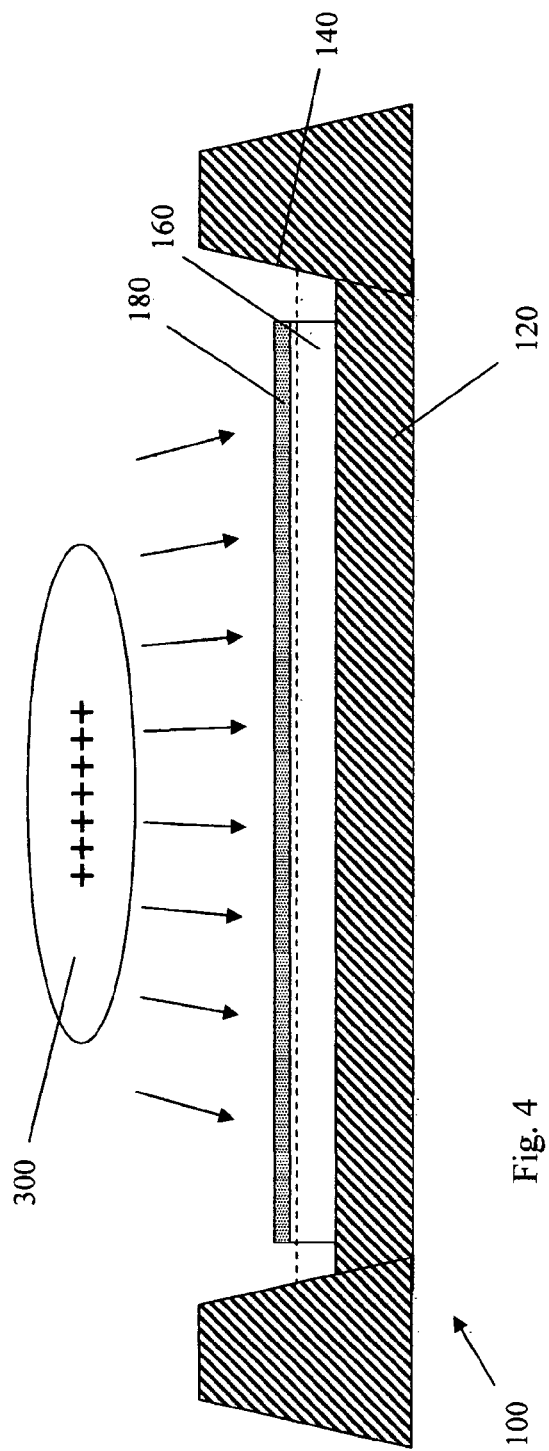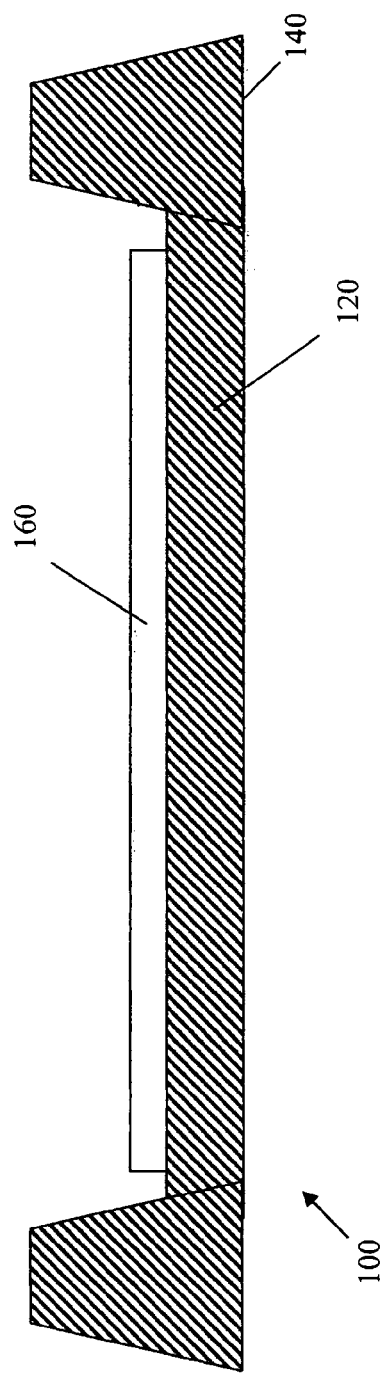

ETCHING/BONDING CHAMBER FOR ENCAPSULATED DEVICES AND METHOD OF USE

CROSS REFERENCE TO RELATED APPLICATIONS

Not applicable.

STATEMENT-REGARDING FEDERALLY SPONSORED RESEARCH

Not applicable.

STATEMENT REGARDING MICROFICHE APPENDIX

Not applicable.

BACKGROUND

This invention relates to encapsulated integrated circuit and microelectromechanical systems (MEMS) devices. More particularly, this invention relates to the prevention, reduction, elimination or purification of outgassing and trapped gases in such devices.

The ability to maintain a low pressure or vacuum for a prolonged period in a microelectronic package is increasingly being sought in such diverse areas as display technologies, micro-electro-mechanical systems (MEMS) and high density storage devices. For example, computers, displays, and personal digital assistants may all incorporate devices which utilize electrons to traverse a vacuum gap to excite a phosphor in the case of displays, or to modify a media to create bits in the case of storage devices, for example.

Microelectromechanical systems (MEMS) are very small moveable structures made on a substrate using lithographic processing techniques, such as those used to manufacture semiconductor devices. MEMS devices may be moveable actuators, sensors, valves, pistons, or switches, for example, with characteristic dimensions of a few microns to hundreds of microns. One example of a MEMS device is a microfabricated cantilevered beam, which may be used to detect the presence of a particular material, for example, a biological pathogen, or which may be used in a high-Q gyroscope. By coating the MEMS cantilever with a suitable reagent, the pathogen may bind with the reagent resulting in mass added to the cantilevered beam. The additional mass may be detected by measuring a shift in the characteristic vibration frequency of the cantilevered beam. However, because air is viscous, the cantilevered beam may be required to operate in a vacuum, so that the viscosity of ambient air does not broaden the resonance peak. Accordingly, MEMS devices such as cantilevered beams may also require vacuum packaging, in order to increase the signal to noise level of the detector to an acceptable level. Many other microdevices may require encapsulation, such as infrared (IR) emitters or detectors, which may need to evacuate the environment around the device to prevent absorption of the infrared radiation.

The packaging of the MEMS device may be accomplished by bonding a lid wafer with a device wafer. The MEMS devices, such as the cantilevered beams or infrared devices, are first fabricated on the device wafer. The lid wafer may then be prepared by etching trenches or device cavities in the lid wafer which will provide clearance for the MEMS device on the device wafer, if additional clearance between device and lid is needed. Before bonding, the lid wafer is aligned with the device wafer, so that the device cavity in the lid wafer is registered above the device on the device wafer, providing clearance for the height of the MEMS device and for its anticipated range of motion.

The lid wafer and device wafer assembly may then be loaded into a wafer bonding chamber, which is then evacuated. The lid wafer is then permanently bonded to the device wafer with a hermetic bond, so that the evacuated environment within the device cavity does not equilibrate with the outside environment by leakage over time. The bond may be made by heating a bonding element, such as an adhesive which is applied between the lid wafer and the device wafer. A glass frit is a commonly used adhesive, which may form a hermetic seal when heated to about 450 degrees centigrade.

One of the major problems with vacuum packaging of electronic devices, including MEMS is the continuous outgassing of hydrogen, water vapor, carbon monoxide, and other components found in ambient air, and from the internal components of the electronic or MEMS device. Typically, to minimize the effects of outgassing, one uses gas absorbing materials commonly referred to as getter materials, disposed within the vacuum cavity surrounding the microdevice. In the case of a MEMS device that does not require a cavity for clearance between device and lid, the getter can be deposited on the flat lid wafer. Generally a getter material is a metal alloy, for example, an alloy of zirconium (Zr), vanadium (V), and iron (Fe) that is sputter deposited on the surface of the lid wafer.

After deposition on the substrate, most gettering materials may form a passivation layer over their exposed surfaces, such as an oxide layer over a metal material. This layer must be removed for the getter material to be operative in its environment. This step of removing the passivation layer is generally called activation of the getter. This activation is generally performed by heating the getter material in the bonding chamber, prior to, after or during bonding of the device wafer to the lid wafer. If this bonding takes place at, for example, 450 degrees centigrade, the bonding temperature may be sufficient to drive the passivation layer off, or into, the deeper portions of the getter material, exposing the getter material again to the environment of the device within the device cavity, and allowing it to getter the impurity gases. Therefore, in such a system using a glass frit adhesive; the getter may be activated when the device is encapsulated with the lid wafer, and the components are heated within the evacuated bonding chamber.

Accordingly, activation of the getter material may be compatible with high temperature adhesives such as glass frits, but may not be compatible with lower temperature adhesives such as metal, solder or metal alloy bonding materials. Furthermore, if activation must take place in the same environment as the bonding occurs, the components of the MEMS device must be able to withstand the activation temperatures. Many MEMS device employ metal layers, which cannot withstand temperatures in excess of a few hundred degrees centigrade, if that.

Therefore, a need exists for a methodology which activates the getters at lower temperatures. A method and apparatus is described herein that provides a low temperature activation for getter materials, which is compatible with low temperature adhesives and low temperature structures used in the MEMS devices. It may also be the case that the method below provides additional performance benefits of a getter in a micromechanical device in that the passivation (contaminated) layer is removed rather than driven in to the bulk of the material. This may provide a more aggressive getter or a getter with greater gettering capacity.

SUMMARY

A device is described which can activate a getter immediately prior to bonding the getter in a device cavity, without exposing the getter to high temperatures. The device uses an etching technique, such as plasma etching, which is installed in the usual wafer bonding chamber to form a combination etching and bonding device. The plasma etcher in the etching/bonding chamber removes the passivation layer from the getter material by etching while the wafer is in the evacuated bonding chamber, and immediately prior to bonding the lid wafer to the device wafer. The device then, bonds the lid wafer to the device wafer, without breaking the vacuum or exposing the getter to any other environment.

In this embodiment, the bonding chamber requires only the addition of a high voltage feed through, a ground ring, a power supply, and a shutter to protect the device wafer from the plasma, to form an etching/bonding chamber. Accordingly, the devices on the device wafer are never required to endure elevated temperature, beyond that required to bond the wafers together. Furthermore, a large number of low temperature adhesives may be used to bond the lid wafer to the device wafer, such as epoxies, glues, solders, eutectics and cements.

The plasma bonder may also include a retractable shutter placed between the devices formed on the device wafer and the plasma, which protects the devices on the device wafer from the etching action of the plasma.

The method may include removing a passivation layer from a gettering surface of the lid wafer prior to bonding, then bonding a device wafer to the lid wafer to encapsulate a device formed on the device wafer and the gettering surface in the device cavity. In some exemplary embodiments, the method for removal of the passivation layer may be plasma etching, which is performed within the bonding chamber. The method may further include loading the lid wafer with a getter material and passivation layer deposited thereon, moving the shutter to protect the device wafer from the plasma, then activating the plasma for about 2 minutes to remove at least about 0.01 µm of passivation layer off the top of the getter material on the lid wafer. The plasma may then be discontinued, the shutter retracted, the wafers aligned and the lid wafer bonded to the device wafer.

An additional advantage of the etching/bonding approach is that the high temperatures typically associated with thermal getter activation are not needed, and therefore alternate (lower temperature) bonding technologies can be used. One embodiment of this method may be to utilize the fact that the etching process may leave a pristine metal surface on the getter material which would then allow the metal of the getter material to participate as a bonding element by, for example, forming an alloy with another metal formed on the other wafer as an adhesive. For example, if gold and indium are deposited on the device wafer, and copper formed on the lid wafer as the getter material, a eutectic bond may be achieved by the formation of a gold/indium alloy on the device wafer side an copper/indium alloy on the lid wafer side which may then form a hermetic seal around the device. In this embodiment, the getter material may cover the entire surface of the lid wafer, and need not be patterned. This may allow substantial simplification of the fabrication process, with a corresponding lowering of fabrication costs.

In other exemplary embodiments the getter material may be the material of the lid wafer itself, rather than a separately deposited thin film. The passivation layer of the lid wafer is then removed by plasma etching, prior to bonding to the device wafer within the bonding chamber. Such embodiments may be particularly inexpensive and easy to implement.

Although the invention is described with respect to a plasma etching embodiment, it should be understood that this is one embodiment only, and that other embodiments which use other means of removing the passivation layer from the getter within the bonding chamber may also be envisioned. Such other methods may be, for example, sputter etching, chemical etching and ion milling.

These and other features and advantages are described in, or are apparent from, the following detailed description.

BRIEF DESCRIPTION OF THE DRAWINGS

Various exemplary details are described with reference to the following figures, wherein:

FIG. 4 is a cross sectional view of an exemplary lid wafer with a getter material deposited thereon and a passivation layer formed over the getter material, undergoing the plasma etch process;

FIG. 5 is a cross sectional view of an exemplary lid wafer with a getter material deposited thereon, after the passivation layer has been removed by the plasma etching process;

DETAILED DESCRIPTION

The systems and methods described herein may be particularly applicable to vacuum encapsulated microelectromechanical (MEMS) devices, however, they may also be applicable to any integrated circuit formed on a device wafer and encapsulated with a getter material on a lid wafer.

Figure 1:
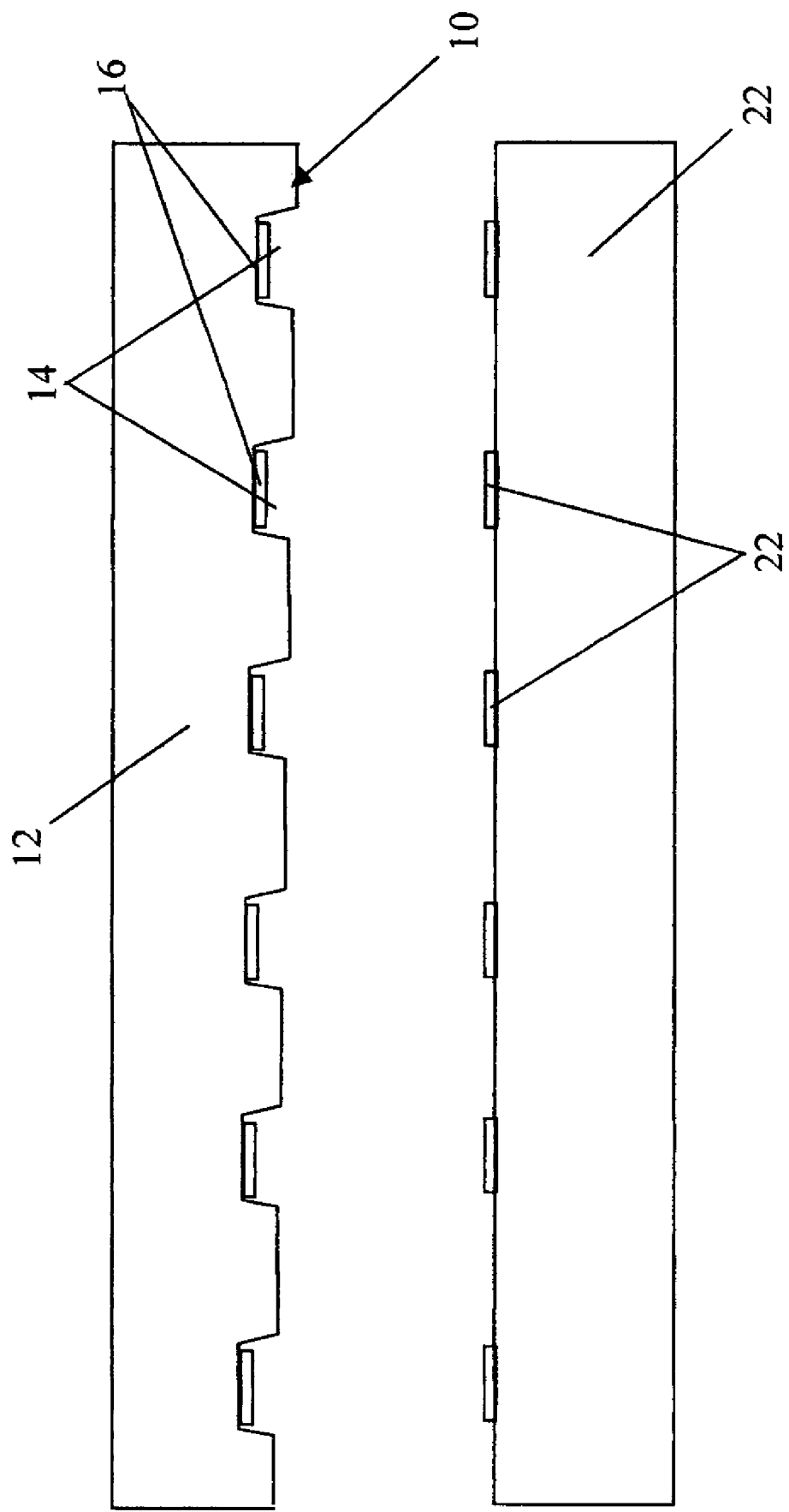
FIG. 1 is a cross sectional view of an exemplary lid wafer with a getter material deposited thereon.

FIG. 1 is a diagram of an exemplary lid wafer 12 upon which a plurality of device cavities 14 may be formed. The device cavities 14 may be formed with a depth sufficient to accommodate a plurality of devices 24 formed on a device wafer 22 below. A "lid" wafer should be understood to mean a wafer which provides encapsulation for a device formed on a device wafer, and may or may not have any additional active structures on it. Upon bonding the lid wafer 12 to the device wafer 22, the device cavities 14 will serve to encapsulate the devices 14 without inhibiting their functioning. It should be noted that in some embodiments of this technology, a cavity on the lid may not be required if the geometry of the device or lid structure ensures adequate clearance between device and lid. In this embodiment, the getter would be deposited on a flat lid wafer. The devices 24 may be microelectromechanical systems (MEMS) devices, such as sensors, actuators, detectors, switches, cantilevers, or the like. Alternatively; the devices 24 may be integrated circuits which require vacuum encapsulation. One exemplary embodiment of an infrared emitting device which may make use of the systems and methods described here is detailed in co-pending U.S. patent application Ser. No. 11/605,312, incorporated, by reference herein in its entirety. Since the details of the devices are not necessary to the understanding of this invention, they are not shown or described in further detail.

Returning to fabrication of the lid wafer 12, before bonding to the device wafer 22, getter material 16 may be deposited in the device cavities 14. After deposition, the getter material 16 may react with the ambient gases, to form a passivation layer 18 over the getter material 16. This passivation layer 18 may be, for example, an oxide layer which forms over a metal surface to some depth, for example, about 0.02 µm on a 1 µm thick getter film. This passivation layer 18 must be removed in order to allow the getter material 16 to perform its gettering function of absorbing impurity gases after encapsulation in the device cavity 14. Accordingly, in order to restore the pristine surface of the getter material 16, the passivation layer 18 must be removed in a noble gas environment, or after encapsulation in the device cavity 14 having a noble gas or vacuum environment. The getter material 16 with passivation layer 18 is shown in FIG. 2.

Figure 2:
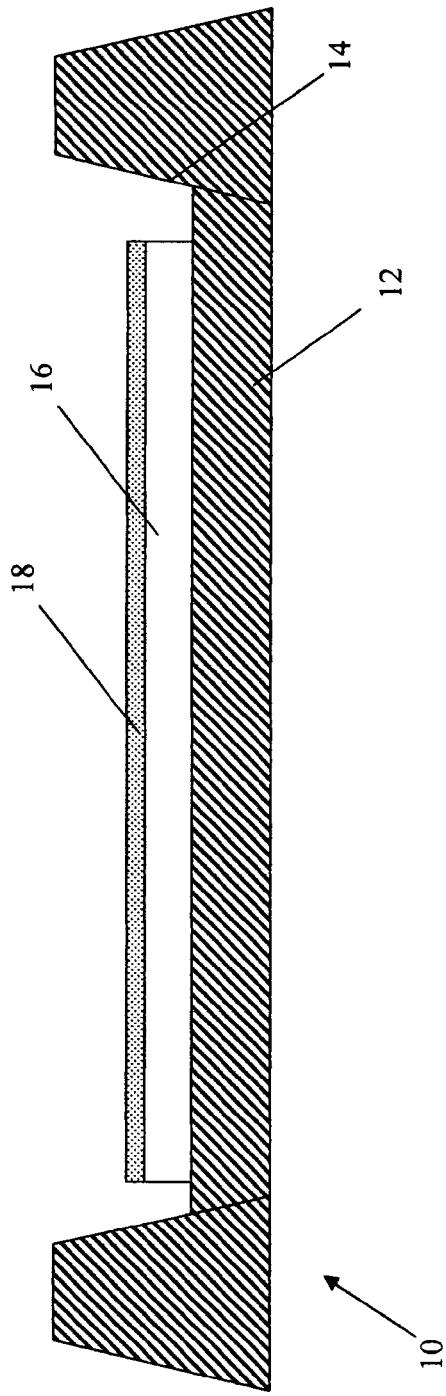
FIG. 2 is a cross sectional view of an exemplary lid wafer with a getter material deposited thereon, and a passivation layer formed over the getter material.
Figure 3:
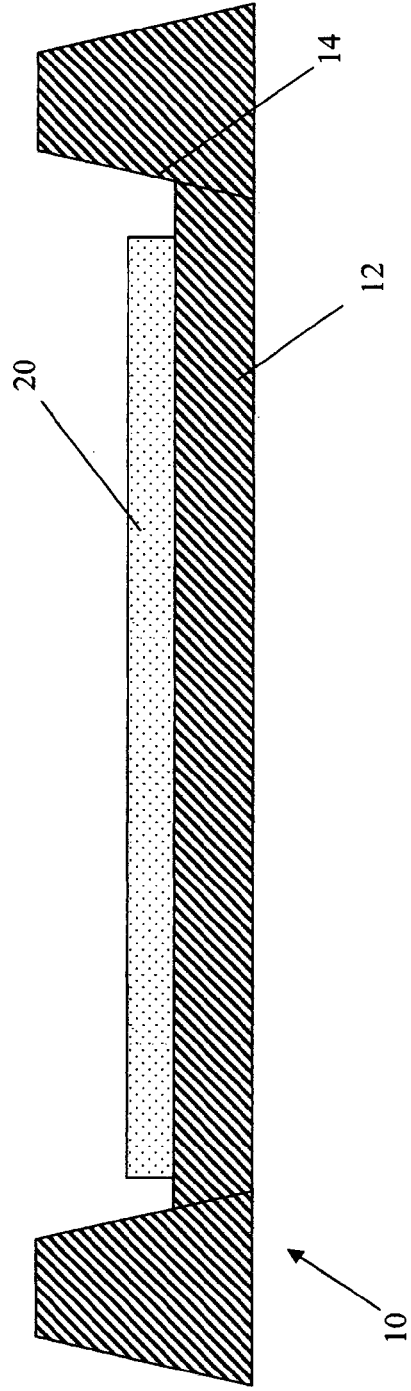
FIG. 3 is a cross sectional view of an exemplary lid wafer with a getter material deposited thereon, after activation of the getter material.

FIG. 2 shows the getter material 16 and passivation layer 18 in a single device cavity 10. However, it should be understood that multiple similar or identical device cavities 14 may exist on the lid wafer 12, and that for ease of depiction, only a single device cavity 10 is shown in FIGS. 2-5. The passivation layer 18 needs to be removed in order to allow the getter material to operate. Such a process may be called activation, because after removal of the passivation layer 18, the getter material 16 may be able to absorb additional impurity gases.

One method of removing the passivation layer 18 is to heat the lid wafer 12, the getter material 16 and the passivation layer 18 to a temperature at which the passivation layer 18 diffuses into the bulk of the getter material 16, leaving the top surface of the getter material 16 exposed again to the ambient environment. Since the passivation layer is typically an oxide, this heat treatment results in oxygen atoms dispersed in the getter material 16 at low concentration. However, the temperature required for such heat activation may be about 450 degrees centigrade, which may destroy some of the delicate structures of the devices 24, such as metal layers forming a cantilevered beam in a MEMS device, for example.

Another method of activation is to remove the passivation layer by mechanical means, such as by etching the passivation layer 18. A plasma etching technique is illustrated in FIG. 4. FIG. 4 shows a lid wafer 120, analogous to lid wafer 12, upon which a getter material 160 is deposited. A passivation layer 180 forms over the getter material 160 by, for example, oxidation of getter material 160. The passivation layer 180 may be removed by exposing the passivation layer 180 to a plasma source in a bonding chamber, as will be described next. After removal of the passivation layer 180, the lid wafer remains in the evacuated bonding chamber until bonding with the device wafer 220, so that the passivation layer 180 cannot reform before encapsulation. The condition of the lid wafer 120 after removal of the passivation layer 180 is shown in FIG. 5.

Figure 6:
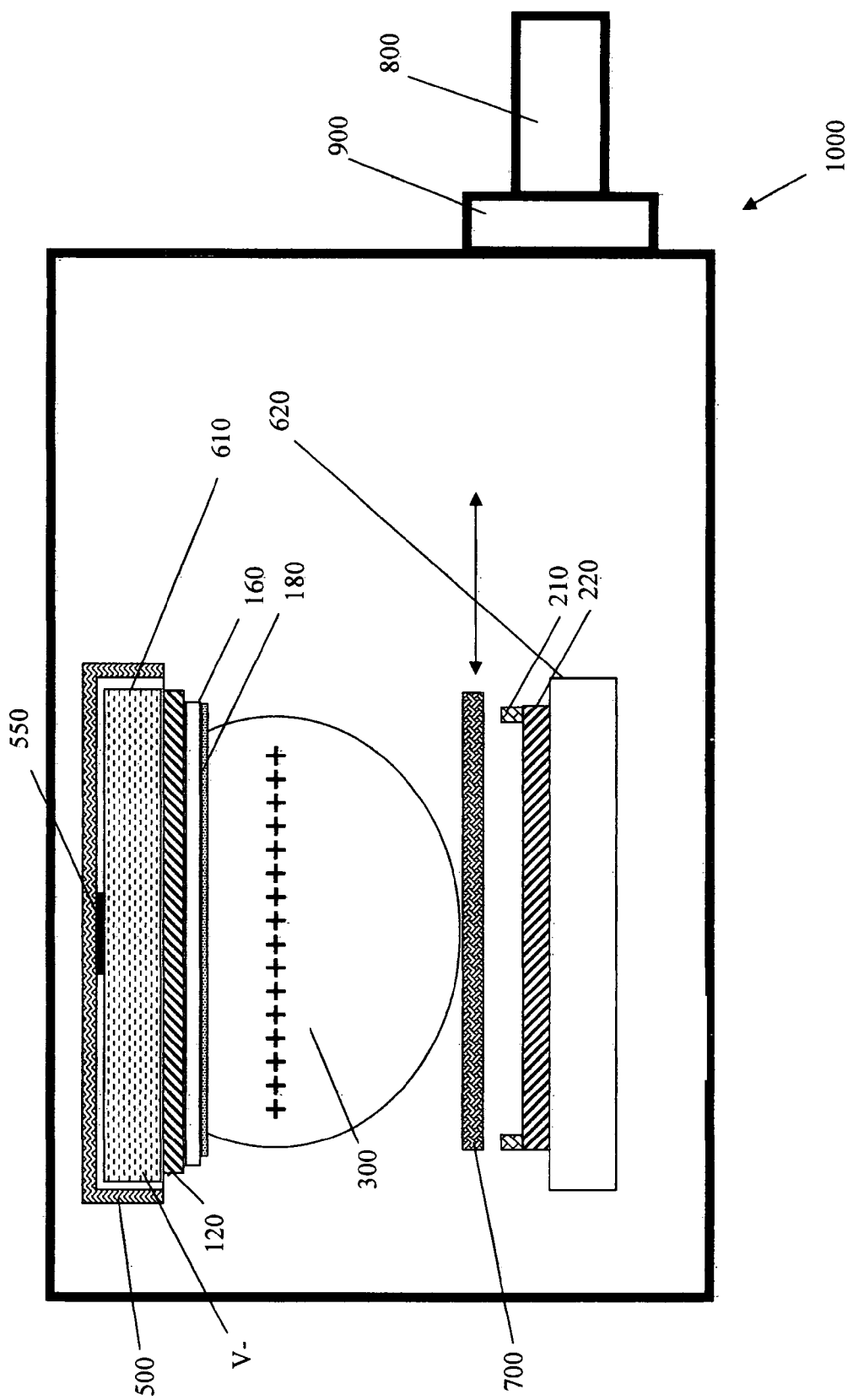
FIG. 6 is a cross sectional view of an exemplary etching/bonding chamber, with activated plasma source.

The plasma etching technique may be implemented using an etching/bonding chamber 1000, such as that illustrated in FIG. 6. A bonding chamber may be equipped with a plasma source by the addition of a high voltage feedthrough to deliver a large voltage to the wafer upon which the getter material 160 is deposited. The voltage may be sufficient to initiate a plasma in the gas environment adjacent to the wafer with the getter material 160 disposed thereon. A retractable shutter may shield the device wafer, also loaded into the bonding chamber, from the etching action of the plasma. In addition, typical sputtering control systems may be added to the bonding chamber to control the plasma etchings such as vacuum controllers mass flow controller and power supplies. The etching/bonding chamber may also be equipped with a high vacuum pump 800 and a valve 900 connecting the pump 800 to the etching/bonding chamber 1000.

By applying a large negative voltage, for example, between about 100 volts and 1000 volts to a negative electrode, the electrons in the neutral gas near the electrode may be torn away from the gas atoms making up the gas to form a plasma 300. The voltage waveform may either be a radio frequency (RF) alternating current (AC) or direct current (DC), and the negative electrode may be the lid wafer 120. If RF, the frequency of the voltage waveform may be about 1 kHz to about 100 MHz The electrons may be accelerated away from the negative electrode and toward a positive or ground electrode. If the gas pressure is within the proper range, the accelerating particles may collide with other neutral molecules with enough kinetic energy to ionize the molecules, causing an avalanche of further ionization. This avalanche may define the formation of the plasma. In one embodiment, the proper pressure environment in the etching/bonding chamber to form the plasma may be about 1 mTorr to about 100 mTorr of an inert gas such as argon, xenon, neon or krypton. More preferably, the environment may be about 10 mTorr of argon gas.

Figure 7:
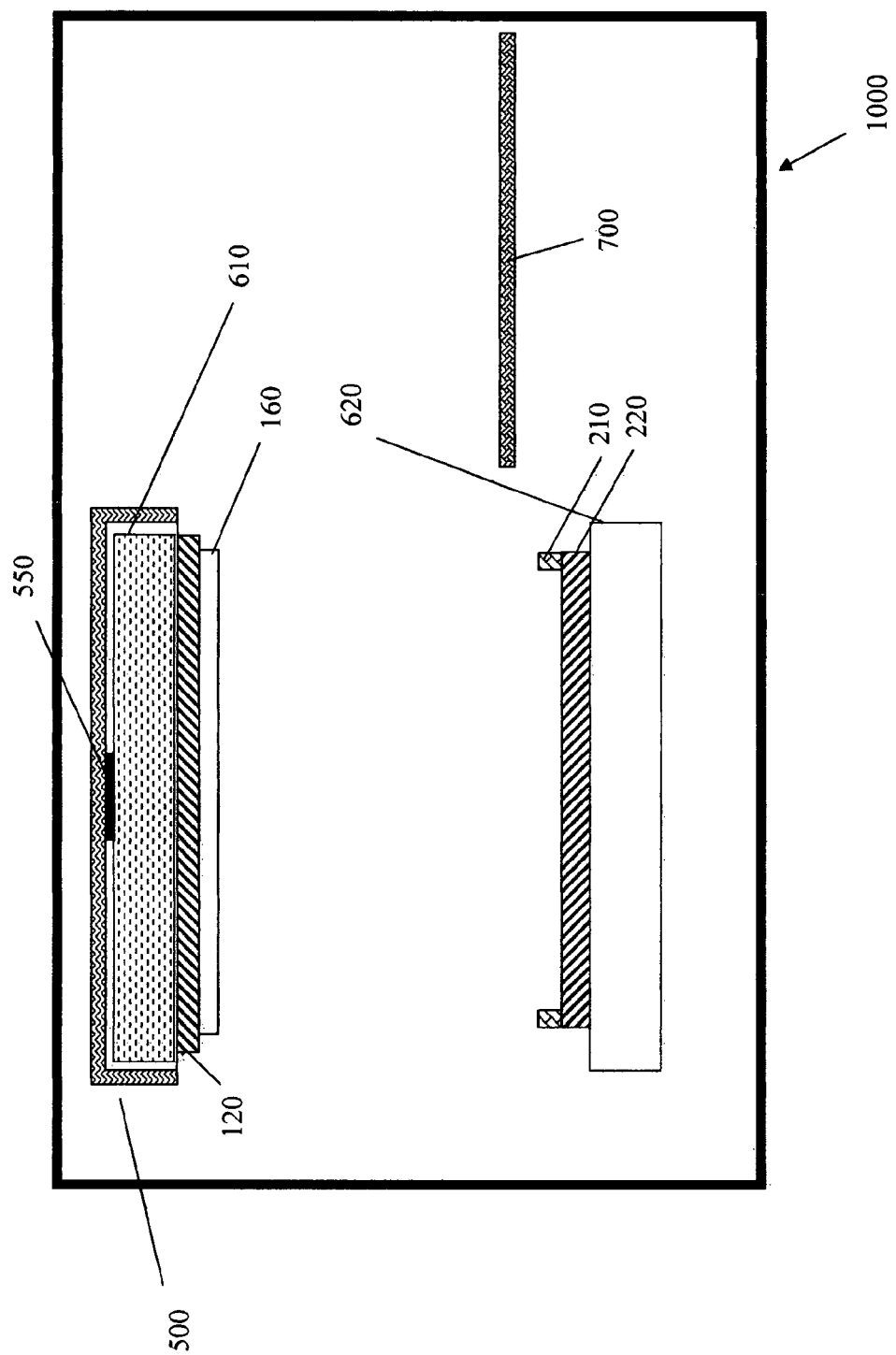
FIG. 7 is a cross sectional view of an exemplary etching/bonding chamber, with the shutter retracted.

In one embodiment, the ground electrode may be the walls of the etching/bonding chamber. The walls of the etching bonding chamber 1000 may be made of aluminum or high vacuum stainless steel and should be grounded to prevent sputtering from the walls. The now positively charged ions are accelerated to the surface of the negatively charged lid wafer 120, where they bombard the surface of the passivation layer 180, breaking away a few atoms of the passivation layer 180. This process may continue until the entire passivation layer 180 has been removed. In one embodiment, the plasma may be operated for about 2 minutes to remove at least about 0.01 µm of material from the top surface of the getter material, which may be, for example, about 0.5 µm to about 3 µm, and more preferably may be about 1 µm thick. This may be sufficient to remove the entire passivation layer 180, leaving a clean surface of getter material 160 able to absorb impurity gases in the device cavity. FIG. 7 illustrates the condition of the lid wafer 120 after removal of the passivation layer 180 from the getter material 160.

Using the etching/bonding chamber 1000, the plasma etching activation process may take place in the same equipment that is used to bond the lid wafer 120 to the device wafer 220. Such an etching/bonding chamber 1000 may be designed to be evacuated and filled with a preferred gas environment for enclosure in the device cavities 140 of the lid wafers 120. Etching/bonding chamber 1000 may include two wafer chucks 610 and 620, which grasp the lid wafer 120 and the device wafer 220.

Figure 8:
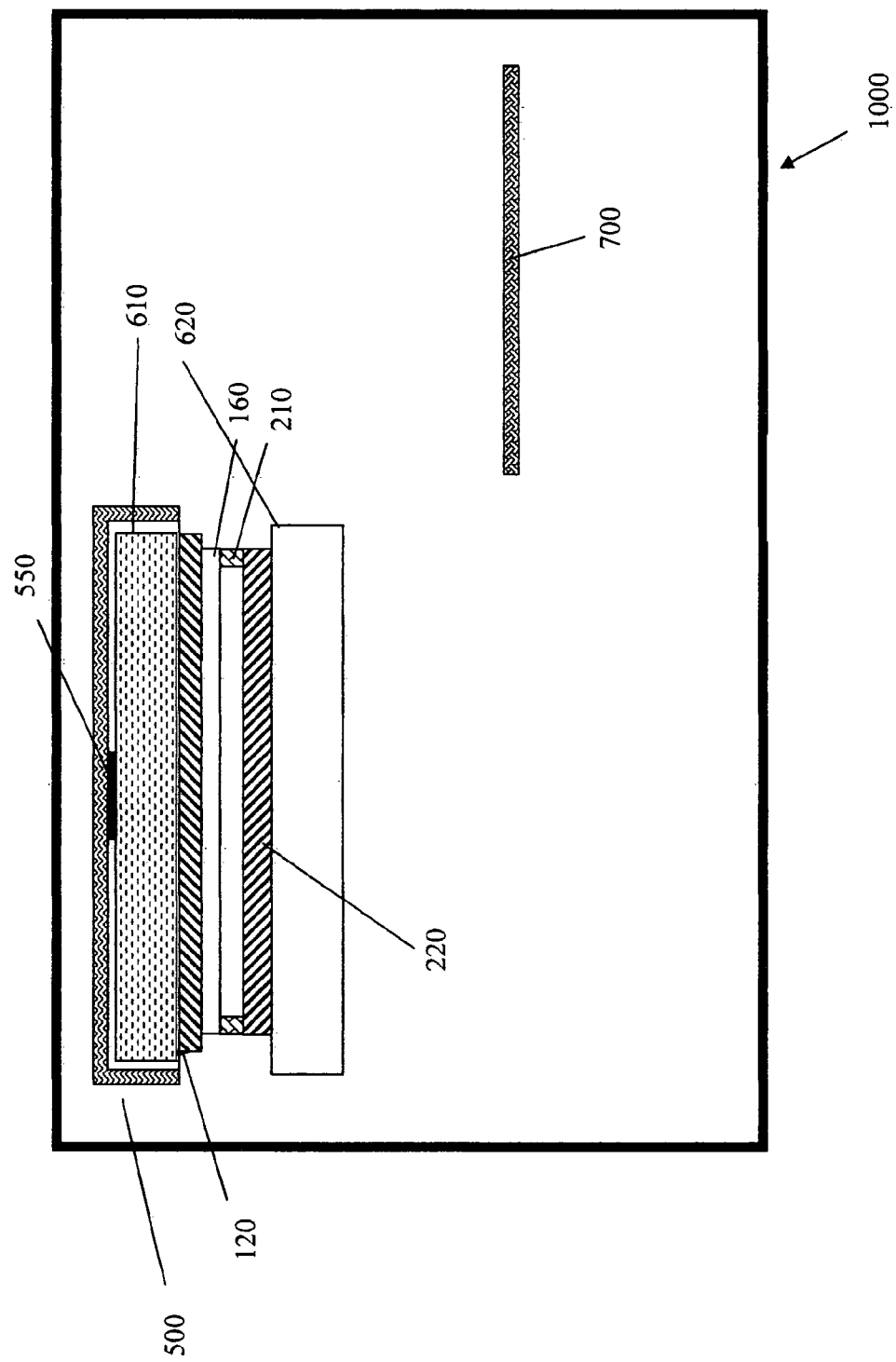
FIG. 8 is a cross sectional view of an exemplary etching/bonding chamber, upon bonding the lid wafer with the device wafer.

Although for simplicity, the individual device cavities 140 are not shown in FIGS. 6-8, it should be understood that lid wafer 120 may have a plurality of device cavities 140 formed therein. Getter material 160 may be deposited in each device cavity as was shown in FIG. 4. The getter material 160 may be patterned such that an individual area of getter material is formed within each cavity, or the getter may be unpatterned, and instead uniformly deposited over the lid wafer 120 surface. This embodiment may be used if the getter material 160 itself participates in the bonding of the lid wafer 120 to the device wafer 220, as will be described more fully below.

The etching/bonding chamber 1000 may also be equipped with a voltage feedthrough, for applying the large negative voltage to the wafer chuck 610 grasping the lid wafer, so that the lid wafer is held at a large negative voltage with respect to the grounded side walls of the etching/bonding chamber. An insulating support 550 may isolate the wafer chuck 610 from a ground ring 500, which surrounds the wafer chuck 610.

The grounding ring 500 may be held at ground potential, but there may exist a very close spacing between the grounding ring 500 and the wafer chuck 610. This spacing is sufficiently close that the plasma is not allowed to form in this region, as it is within a mean free path of an electron in the gas. For example, if the pressure of the gas within the etching/bonding chamber is about 10 mTorr, the mean free path is about 7 mm. The grounding ring may be at a distance of about 1 mm from the wafer chuck 610, so that no plasma is able to form in this small gap. The purpose of the grounding ring is to roughly confine the plasma 300 to the area adjacent to the getter material 160 surface, as shown in FIG. 6.

A shutter 700 may protect the device wafer 220 from the etching action of the plasma 300. During operation of the plasma on the lid wafer 120, the shutter 700 may be in the extended position as shown in FIG. 6, wherein the shutter 700 blocks the ionized species from bombarding the device wafer 220. The shutter 700 may be held at a separation of about 5 cm from the lid wafer 120 with getter material 160, and in front of the device wafer 220. The shutter may be made from, for example, high vacuum stainless steel or aluminum, and may be at least about six inches in length to completely protect the surface of a six inch device wafer 220.

When the plasma etching is complete and the passivation layer 180 has been removed, the shutter 700 may be retracted as shown in FIG. 7. This allows clearance for the device wafer 220 to be brought against the lid wafer 120 for alignment and bonding, as will be described further below. The retraction of the shutter 700 may be accomplished manually by a set of suitable mechanical linkages, or may be motorized by implementation of a suitable motor in the etching/bonding chamber. As such techniques are well known in the art, they are not described or depicted further herein.

A wide selection of materials may be used in the systems and methods described here. The device wafer 220 may be composed of any number of satisfactory substrate materials, such as silicon, gallium arsenide, silicon on insulator (SOI), glass, sapphire, and the like. In one embodiment, the device wafer 220 is silicon, 675 µm thick. The getter material 160 on the lid wafer 120 may be any material capable of gettering gases, such as an alloy of zirconium, vanadium, titanium and iron with the constituents in a weight ratio of 60/20/15/5 respectively, or a pure metal, such as Cu, Fe, or Mg. The aforementioned getter material is described in greater detail in U.S. application Ser. No. 11/819,338, incorporated by reference herein in its entirety. The getter material may be sputter deposited through a shadow mask, as described in further detail in the '338 application. The preferred gases to be enclosed in the device cavity may be insulating gases such as sulfur hexafluoride ($SF_6$), helium (He), nitrogen ($N_2$), argon (Ar), and neon (Ne). The preferred environment may also be vacuum, partial vacuum and high pressure environments to be sealed hermetically in the device cavity.

The lid wafer 120 may likewise be any number of satisfactory materials, but metal lid wafers 120 may be of particular use in the systems and methods described herein. Most non-noble metals may be classified as "getters", in that they tend to absorb impurity gases and form oxide layers which subsequently passivate their gettering ability. By using the etching/bonding chamber, the layer of passivation on a metal lid may be removed in the region that will form the device cavity, immediately before bonding to a device wafer 220, such that the material of the lid itself provides the gettering function. In this embodiment, the additional, separate getter material 160 may be eliminated, as the material of the lid wafer itself may perform the gettering. Suitable materials for the lid wafer 120 in this embodiment include copper, silicon, iron, Kovar (a nickel cobalt ferrous alloy, with typically of 29% nickel, 17% cobalt, 0.2% silicon, 0.3% manganese, and 53.5% iron), Invar (an alloy of 64% iron and 36% nickel, with, optionally, some carbon and chromium), NiFe for RF shielding, aluminum or other non noble metals or alloys.

Furthermore, using the systems and methods described here, additional materials may be used which are not normally used as getters. Such materials may include low melting point metals, such as copper and indium, which may be used as the getter material 160 with the etching/bonding chamber 1000. Virtually any pure, unoxidized metal or unoxidized metal alloy that reacts with a gaseous impurity may be used as the gettering material 160, including, for example, aluminum, antimony, beryllium, bismuth, cadmium, chromium, cobalt, iron, lead, magnesium, manganese; molybdenum, nickel, rhodium, silicon, sodium, tantalum, tungsten, vanadium, zinc, zirconium, and alloys thereof.

To bond the device wafer 220 to the lid wafer 120, an adhesive agent 210 may be applied to the device wafer. Although the adhesive agent 210 is shown in FIGS. 6-9 as only around the edge of the wafers, it should be understood that this is for ease of depiction only, and that the adhesive agent 210 may be applied around the perimeter of every device to be enclosed in a device cavity, or around every device cavity 140. The adhesive agent 210 may be formed in one or more layers between about 1 µm and about 5 µm thick and at least about 50 µm wide.

Because the passivation layer 180 has already been removed, and the getter material 160 is ready to operate, virtually any adhesive agent may be used, including adhesives that cure at low temperature. Adhesives may be used which function at substantially less than 450 degrees centigrade, for example, between about 150 degrees centigrade and about 400 degrees centigrade. Examples of low temperature adhesive agents may be cement, glue, photoresist, epoxy, cyanoacrylates, metals and solders. Metal materials may be used, for example, which may form a hermetic bond by forming an alloy with the metal of the getter material 160. Further details of a suitable metal alloy bond may be found in U.S. patent application Ser. No. 11/211,622 and U.S. patent application Ser. No 11/304,601 incorporated by reference herein in their entirety. Alternatively, if the lid wafer 120 is made of a suitable metal material, the hermetic alloy seal may be made between the adhesive agent 210 and the metal of the lid wafer 120. One such metal alloy bonding system may be a layer of indium and a layer of gold as the adhesive agent 210, which when brought into contact with a clean surface of a copper lid wafer 120, may form a gold/indium/copper alloy which is a hermetic bond. Other alloy bonding systems include other indium alloys, gold tin alloys, and lead tin alloys which may act as solders in conjunction with the copper lid wafer 120.

If a solder such as lead/tin or gold/tin, for example, is used in combination with a solderable metal lid, such metal lid materials may be aluminum, Kovar (a nickel cobalt ferrous alloy, with typically of 29% nickel, 17% cobalt, 0.2% silicon, 0.3% manganese, and 53.5% iron), Invar (an alloy of 64% iron and 36% nickel, with, optionally, some carbon and chromium), silicon, stainless steel, for example, or any other metal system which is solderable. Such solder systems generally have too low of a melting temperature to be compatible with the prior art heat treatment method of activation of the getter material 160.

In either of the aforementioned adhesive+metal lid bonding systems, if the metal lid is to participate in the bonding, the device cavities may be etched prior to insertion in the bonding chamber using, for example, a wet chemical etch with a patterned photoresist layer to define the device cavities. Such an approach may be particularly easy and inexpensive to implement.

Furthermore, in some embodiments, since the getter material 160 may participate in the metal bond between the device wafer 220 and the lid wafer 120, the getter material 160 need not be patterned but may instead be deposited as a substantially uniform sheet over the lid wafer, as shown in FIGS. 6-8. This may result in significant process simplification, as the wafers also may need no careful alignment, but may only require rough mechanical pin alignment to register the device cavities properly over the devices on the device wafer. Such rough alignments are generally capable of the +/−25 μm tolerance required for the proper registration of the cavities. With the prior art methods, the metal of the bond line on the lid wafer had to be aligned with the metal of the bond line on the device wafer, which a separate high precision alignment step. In addition, the getter material required patterning to avoid overlapping with the area reserved for the adhesive material of the bond line which also contributed to the need for high precision alignment.

After retracting the shutter 700, the lid wafer 120 may be aligned with the device wafer 220 for bonding. Since the getter material 160 is not necessarily patterned, only the mechanical pin alignment may be required to provide adequate alignment of the two wafers. After alignment, the wafers may be brought together to form a wafer assembly and pressed against each other with a bonding pressure of, for example, about 0.5 atm to about 2.0 atm. The wafer assembly may then be heated to a temperature adequate to cure the adhesive or melt the metal films to form the alloy or solder bond. Suitable bonding systems are described in further detail in U.S. patent application Ser. No. 11/390,085 and U.S. patent application Ser. No. 11/304,601, incorporated by reference herein in their entireties. In one embodiment of this process, the wafer assembly may be removed from the bonding system after a sufficient hermetic seal is achieved in the bond, then moved to an inexpensive oven to bake for additional time needed to improve the strength of the bond. This may be done to improve the through put capacity of the more expensive bonding chamber. The condition of the device wafer 220 and the lid wafer 120 with adhesive agent 210 after bonding is shown in FIG. 8.

Figure 9:
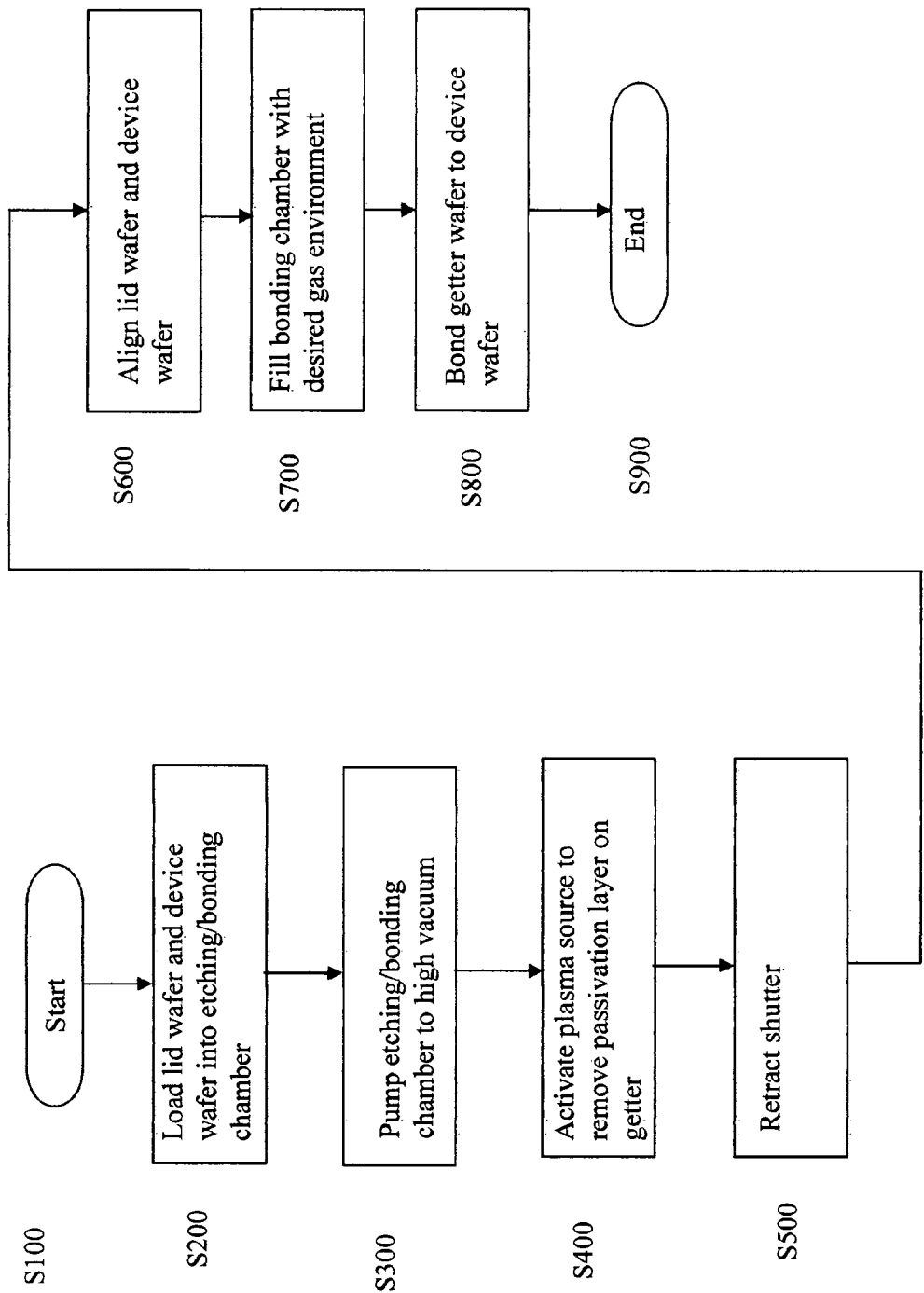
FIG. 9 is a flowchart of an exemplary method for manufacturing a vacuum encapsulated MEMS device with the etching/bonding chamber.

FIG. 9 is a flow chart describing an exemplary method for manufacturing an encapsulated device using an etching/bonding chamber. The method begins in step S100 and proceeds to step S200, wherein the lid wafer and device wafer are loaded into the etching/bonding chamber. In step S300, the etching/bonding chamber is evacuated and partially filled with an atmosphere suitable for forming a plasma. A suitable pressure may be about 10 mTorr in an argon atmosphere. In step S400, the plasma source is activated. In some exemplary embodiments, the plasma source is activated by applying a large negative voltage to the wafer chuck holding the lid wafer with the getter material deposited thereon. The plasma source remains activated until the passivation layer on the getter material has been removed. In some exemplary embodiments, the passivation layer is removed from the metal material of the lid wafer itself, rather than from a separate getter material. In step S500, the shutter is retracted to allow the device wafer to be brought against the lid wafer. In step S600, the lid wafer and device wafer are aligned relative to each other, so that the device cavities are properly registered over the devices on the device wafer. In step S700, the etching/bonding chamber is filled with a preferred gas environment. In some exemplary embodiments, this preferred gas may be an insulating gas which resists electrical breakdown, such as sulfur hexafluoride or a freon. In step S800, the lid wafer and device wafer are bonded, typically by heating an adhesive agent applied either to the lid wafer or the device wafer or both. The process ends in step S900.

It should be understood that the steps shown in FIG. 9 need not necessarily be performed in the order indicated. For example, the lid wafer and device wafer may be aligned before the shutter is retracted, rather than after. Also, not all of the steps may be required to perform the method, for example, the etching/bonding chamber need not be filled with a preferred gas environment, if the device cavity is intended to remain evacuated.

The systems and methods described here may result in an improved and wider selection of possible adhesive systems and components used in devices, because these items need not be required to withstand high temperatures. The prior art method used high heat to remove the passivation layer from the getter material in order to activate it. Since activation was typically the last step in the manufacturing process, all the delicate components of the device were required to withstand the high heat. The systems and methods described here may also result in a simpler, higher yielding, and higher throughput bonding process due to the elimination of a separate lid-to-device high precision wafer alignment step. as well as the elimination of a separate metal plating or sputtering step on the lid wafer (the getter provides the material for the eutectic bond on the lid wafer instead of a separate plated or sputtered film). The systems and methods described here may also provide for improved getter performance, as the contaminants are removed, as opposed to driven into the bulk of the film, which could limit the ultimate absorption rate or capacity of future gettering. The methods and systems described here may also greatly increase the choices of suitable getter materials, as the surface contaminants of many highly reactive materials may not easily drive into the bulk of the film with standard heat activation and leave a good gettering surface like conventional Zr based alloys are known to do.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. For example, while the systems and methods are described with respect to a system using getter material which forms a passivation layer, it should be understood that this embodiment is exemplary only, and that the systems and methods disclosed here may also be applied to a metal lid wherein the metal of the lid acts as the getter material. Furthermore, the passivation layer may be removed by other sorts of plasmas, such as ion milling. Accordingly, the exemplary implementations set forth above, are intended to be illustrative, not limiting.

What is claimed is:

1. A method for forming an encapsulated device, comprising:
    disposing a getter material on at least one of two wafers, wherein the getter material absorbs impurity gases;
    plasma etching an outer layer of getter material from the getter material; and
    bonding the two wafers together to encapsulate a device formed on one of the wafers and the getter material in a device cavity defined by the two wafers, and wherein the etching step and the bonding step both take place within a single substantially sealed etching/bonding chamber.

2. The method of claim 1, wherein the outer layer is at least 0.01 μm thick and includes a passivation layer formed over the getter material, wherein the getter material is deposited within the device cavity formed on a lid wafer.

3. The method of claim 2, wherein the getter material is deposited on one of the wafers substantially uniformly, in an unpatterned sheet, covering substantially an entire wafer surface and a plurality of device cavities.

4. The method of claim 1, wherein bonding the two wafers together comprises bonding a device wafer and a lid wafer together with a substantially hermetic seal.

5. The method of claim 4, wherein the substantially hermetic seal comprises a metal alloy bond.

6. The method of claim 5, wherein the getter material comprises at least one of copper, aluminum, iron, a nickel-cobalt alloy, zirconium, vanadium, titanium, iron and alloys thereof.

7. The method of claim 6, wherein bonding the device wafer to the lid wafer comprises bonding at least one metal film deposited on the device wafer to at least one of the metal of the lid wafer and a metal layer deposited on the lid wafer to form an alloy seal with at least one of the metal layer and the metal of the lid wafer.

8. The method of claim 4, wherein the substantially hermetic seal seals an environment within the device cavity that contains at least one of sulfur hexafluoride ($SF_6$), helium (He), nitrogen ($N_2$), argon (Ar), neon (Ne), vacuum, partial vacuum and high pressure.

9. The method of claim 1, further comprising:
aligning one wafer to the other wafer;
applying pressure between the two wafers; and
applying heat to the two wafers.

10. The method of claim 1, wherein plasma etching the outer layer from the getter material is performed in an environment of about 10 mTorr of at least one of argon, krypton, xenon and neon, with a voltage of between about −100 volts and about −1000 volts applied to the lid wafer.

11. The method of claim 1, further comprising:
applying an adhesive between the two wafers, wherein the adhesive forms a substantially hermetic seal at a temperature substantially less than 400 degrees centigrade.

12. The method of claim 11, wherein the adhesive comprises at least one of cement, glue, epoxy, photoresist, cyanoacrylates, solder and metal.

13. The method of claim 11, wherein the getter material is copper, and the adhesive comprises at least one layer of at least one of gold, indium, lead, a lead-tin alloy, an indium alloy, and a gold-tin alloy.

14. Method of claim 11, wherein the adhesive bonds to the getter material, which is deposited on at least one of the two wafers.

15. The method of claim 1, wherein the getter material is the material of at least one of the two wafers, and comprises at least one of silicon, copper, aluminum, iron, a nickel-iron alloy and a nickel-cobalt alloy.

16. The method of claim 1, wherein the getter material comprises at least one of a pure metal and an unoxidized metal alloy that reacts with a gaseous impurity.

17. A method for forming an encapsulated device, comprising:
removing an outer layer from a getter material formed on at least one of two wafers, wherein the gettering surface absorbs impurity gases; and
bonding the two wafers together to encapsulate a device formed on one of the wafers and the getter material in a device cavity defined by the two wafers; wherein bonding the two wafers together comprises bonding a device wafer and a lid wafer together with a substantially hermetic seal, and the removing step and the bonding step both take place within a single substantially sealed etching/bonding chamber, and wherein the substantially hermetic seal comprises a metal alloy bond, formed including a metal of the getter material.

* * * * *